US006650032B2

(12) United States Patent
Sumrak et al.

(10) Patent No.: US 6,650,032 B2
(45) Date of Patent: Nov. 18, 2003

(54) ELECTRONIC COMPENSATOR FOR A PIEZOELECTRIC ACTUATOR

(75) Inventors: Thomas Allen Sumrak, Smithfield, VA (US); David Paul Wieczorek, Seaford, VA (US)

(73) Assignee: Siemens Automotive Corporation, Auburn Hills, MI (US)

( * ) Notice: Subject to any disclaimer, the term of this patent is extended or adjusted under 35 U.S.C. 154(b) by 0 days.

(21) Appl. No.: 10/159,281

(22) Filed: Jun. 3, 2002

(65) Prior Publication Data

US 2002/0195904 A1 Dec. 26, 2002

Related U.S. Application Data

(63) Continuation of application No. 09/608,961, filed on Jun. 30, 2000, now Pat. No. 6,400,066.

(51) Int. Cl.$^{7}$ .......................... H01L 41/083; H02N 2/02

(52) U.S. Cl. ..................... 310/346; 123/472; 239/102.1

(58) Field of Search ......................... 310/346; 123/472; 239/102.1, 102.2

(56) References Cited

U.S. PATENT DOCUMENTS

| | | | |
|---|---|---|---|
| 4,022,166 A | 5/1977 | Bart | 123/32 |
| 4,550,744 A | 11/1985 | Igashira et al. | 137/80 |
| 4,584,980 A | 4/1986 | Weiger et al. | 123/458 |
| 4,725,002 A | 2/1988 | Trachte | 239/102.2 |
| 4,750,706 A | 6/1988 | Schlagmuller | 251/129.06 |
| 5,186,151 A | 2/1993 | Schwerdt et al. | 123/506 |
| 5,740,969 A | 4/1998 | Hoffmann et al. | 239/533.2 |
| 5,810,255 A | 9/1998 | Itoh et al. | 239/102.2 |
| 5,819,710 A | 10/1998 | Huber | 123/498 |
| 6,079,636 A | 6/2000 | Rembold et al. | 239/88 |
| 6,148,842 A | 11/2000 | Kappel et al. | 137/79 |
| 6,196,472 B1 | 3/2001 | Cooke | 239/88 |
| 6,400,066 B1 | 6/2002 | Sumrak et al. | 310/346 |

FOREIGN PATENT DOCUMENTS

| | | |
|---|---|---|
| DE | 43 06 072 C2 | 2/1993 |
| DE | 43 06 073 C1 | 2/1993 |
| DE | 44 06 522 C1 | 2/1994 |
| DE | 44 12 948 A1 | 4/1994 |
| DE | 195 04 175 A1 | 2/1995 |
| DE | 195 29 667 A1 | 8/1995 |
| DE | 197 27 992 A1 | 7/1997 |
| DE | 197 50 149 A1 | 11/1997 |
| DE | 198 04 196 A1 | 2/1998 |
| DE | 198 34 461 A1 | 7/1998 |
| DE | 198 34 673 A1 | 7/1998 |
| DE | 198 36 561 A1 | 8/1998 |
| DE | 198 38 862 A1 | 8/1998 |
| DE | 198 57 338 C1 | 12/1998 |
| DE | 199 52 946 A1 | 11/1999 |
| EP | 0 795 081 B1 | 11/1995 |
| WO | WO 98/44256 | 10/1998 |

*Primary Examiner*—Michael C. Zarroli

(57) ABSTRACT

A fuel injector comprises a tube assembly, a stem assembly, and a plurality of sets of piezoelectric elements. The tube assembly includes a seat defining an opening through which fuel enters an internal combustion engine. The stem assembly includes a cap and a stem that are relatively movable with respect to one another. A gap is located between the stem and cap when the stem contiguously engages the seat such that fuel flow through the opening is prevented. A first set of piezoelectric elements moves the cap in response to a first electric field, and a second set of piezoelectric elements moves the first set of piezoelectric elements in response to a second electric field. A sensor measuring the gap compensates the second electric field for physical changes in at least one of the tube and stem assemblies.

9 Claims, 3 Drawing Sheets

ELECTRONIC COMPENSATOR FOR A PIEZOELECTRIC ACTUATOR

STATEMENT OF RELATED APPLICATIONS

This application is a continuation patent application under 37 C.F.R. §1.53(b) of Ser. No. 09/608,961, filed Jun. 30, 2000, and which is now U.S. Pat. No. 6,400,066.

BACKGROUND OF THE INVENTION

The present invention relates to an electronic compensator for a piezoelectric actuator, and more particularly to a fuel injector actuator having a plurality of sets of piezoelectric elements, at least one of which is connected to an electronic compensator circuit.

A conventional piezoelectric element is a ceramic structure whose axial length changes in the presence of an electric field created by applying a voltage across the element.

In typical applications, the axial length of the element can change by, for example, approximately 0.12%. In a stacked configuration of elements, the change in the total axial length of the stack is equal to the sum of the changes in axial length of each element in the stack. As is known, applying a voltage to a piezoelectric element, or to a stack of piezoelectric elements, results in a nearly instantaneous expansion of the actuator and an instantaneous movement of any structure connected to the actuator.

It is known to use a single set of piezoelectric elements, i.e., a stack of piezoelectric elements across which a common voltage is applied, to actuate a fuel injector for an internal combustion engine. Such piezoelectric actuators precisely open and close an injector valve element for precisely metering fuel flow into a combustion chamber.

The thermal and pressure effects present in the piezoelectrically actuated injector's operating environment can cause dimensional changes within the injector. These dimensional changes result in a change to the injector's stroke, causing an unstable shift in its flow characteristics. To compensate for the dimensional changes, it is known to fabricate injectors from exotic materials, which exhibit low thermal expansion. In addition, it is also known to calibrate injector strokes to anticipate elongation of the valve body. However, these methods are costly and inefficient.

SUMMARY OF THE INVENTION

Advantages of the claimed invention include increasing the stroke of the piezoelectric actuator, compensating for thermal expansion in different operating condition, and compensating for mechanical deformation under different fuel pressures and assembly stresses.

The present invention provides a fuel injector that comprises a tube assembly having a longitudinal axis extending between a first end and a second end; a seat secured at the second end of the tube assembly, the seat defining an opening; a stem assembly including a cap movable with respect to the tube assembly and a stem movable with respect to the seat, the stem moving between a first position wherein the stem contiguously engages the seat such that fuel flow through the opening is prevented and a second position wherein the stem is spaced from the seat such that fuel flow through the opening is permitted; a gap between the cap and the stem in the first position, the gap promoting sealing between the seat and the stem in the first position and being eliminated in the second position of the stem; a first set of piezoelectric elements contiguously engaging the cap, the first set of piezoelectric elements moving the cap in response to a first electric field; and a second set of piezoelectric elements moving the first set of piezoelectric elements in response to a second electric field.

The present invention also provides a fuel injection system that comprises a fuel injector and a control circuit. The fuel injector includes a tube assembly having a longitudinal axis extending between a first end and a second end; a seat secured at the second end of the tube assembly, the seat defining an opening; a stem assembly including a cap movable with respect to the tube assembly and a stem movable with respect to the seat, the stem moving between a first position wherein the stem contiguously engages the seat such that fuel flow through the opening is prevented and a second position wherein the stem is spaced from the seat such that fuel flow through the opening is permitted; a gap between the cap and the stem in the first position, the gap promoting sealing between the seat and the stem in the first position and being eliminated in the second position of the stem; a first set of piezoelectric elements moving the stem assembly in response to a first electric field; and a second set of piezoelectric elements moving the first set of piezoelectric elements in response to a second electric field. The control circuit includes a first driver supplying a first electrical signal generating the first electric field; a second driver supplying a second electrical signal generating the second electric field; a sensor measuring the gap and providing an output signal proportional to gap size; and a controller comparing the output signal to a reference signal and adjusting the second electrical signal in response to changes in the gap size.

The present invention also provides a method of compensating a fuel injector for thermal expansion and mechanical deformation. The fuel injector includes a tube assembly having a longitudinal axis extending between a first end and a second end, a seat secured at the second end of the tube assembly and defining an opening, a stem assembly including a cap movable with respect to the tube assembly and a stem movable with respect to the seat, the stem moving between a first position wherein the stem contiguously engages the seat such that fuel flow through the opening is prevented and a second position wherein the stem is spaced from the seat such that fuel flow through the opening is permitted, a gap between the cap and the stem in the first position, a first set of piezoelectric elements moving the stem assembly in response to a first electric field, and a second set of piezoelectric elements moving the first set of piezoelectric elements in response to a second electric field. The method comprises generating an output signal that is proportional to at least one of thermal expansion and mechanical deformation in at least one of the tube and stem assemblies; comparing the output signal with a reference signal; and adjusting the second electric field in response to variations between the output signal and the reference signal.

BRIEF DESCRIPTION OF THE DRAWINGS

The accompanying drawing, which is incorporated herein and constitutes a part of this specification, illustrates an embodiment of the invention, and, together with the general description given above and the detailed description given below, serve to explain features of the invention.

DETAILED DESCRIPTION OF THE PREFERRED EMBODIMENTS

A fuel injector can include a piezoelectric multi-element actuator that changes in length in response to an electric field, which is created by a control voltage applied across the piezoelectric elements. The actuator can be coupled to a valve member for opening and closing the fuel injector.

Figure 1:
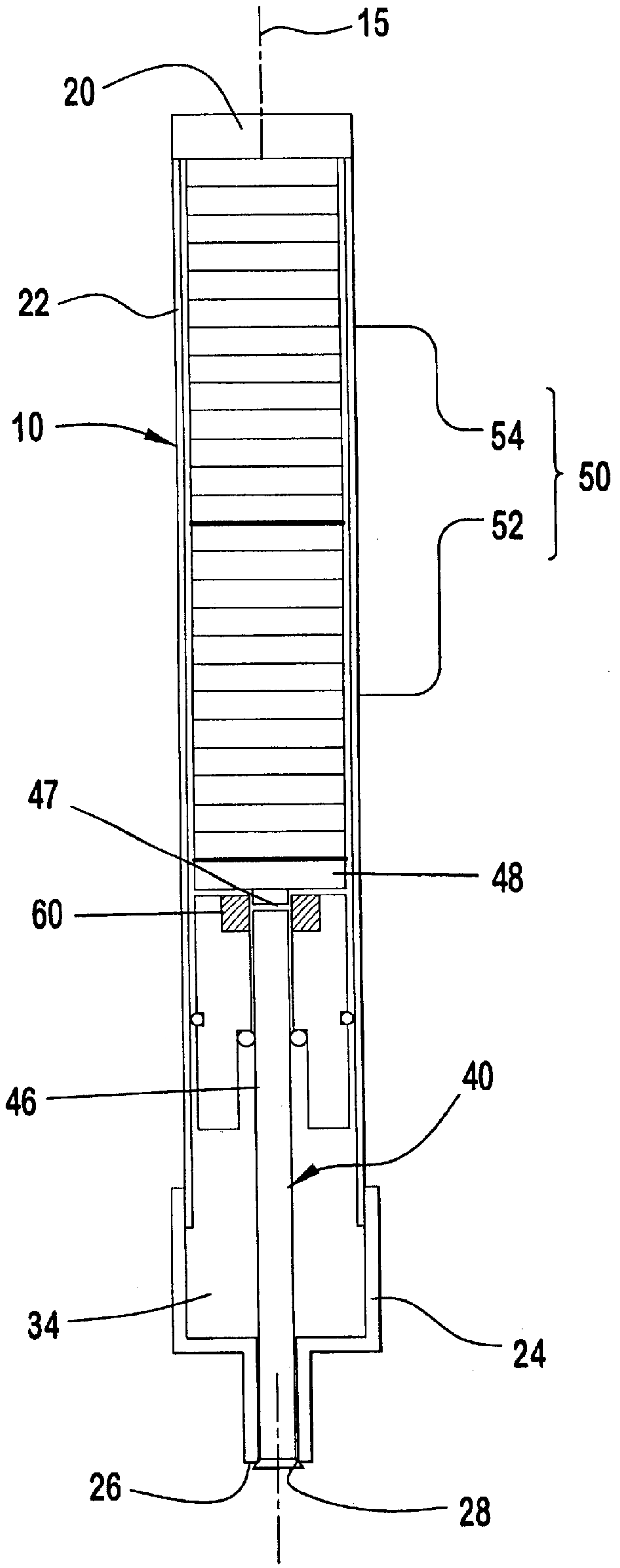
FIG. 1 is a cross-sectional view of a fuel injector including a piezoelectric actuator according to the claimed invention.

Referring to FIG. 1, a fuel injector includes a tube assembly 10 having a first end portion 20, a central portion 22, and a valve body 24 at a second end portion. The first portion 20, central portion 22, and valve body 24 can be aligned along an axis 15 and can be fixed together. A seat 26 having an opening 28 is fixed to the valve body 24 at an opposite end from the central portion 22. Fuel can be supplied to a chamber 34 connected to the opening 28.

A stem assembly 40 extends along the axis 15 and is reciprocally mounted with respect to the seat 26. The stem assembly 40 moves between a first position wherein the stem assembly 40 contiguously engages the seat 26 such that fuel flow through the opening 28 is prevented and a second position wherein the stem assembly 40 is spaced from the seat 26 such that fuel flow through the opening 28 is permitted. A resilient element (not shown), which can be located in the chamber 34, biases the stem assembly 40 toward the first position.

The stem assembly 40 is displaced toward the first position by a piezoelectric actuator assembly 50. According to the claimed invention, the piezoelectric actuator includes at least a first set of piezoelectric elements 52 and a second set of piezoelectric elements 54 that are assembled together in series, and can be commonly aligned along the axis 15. These two sets 52,54 can operate individually or simultaneously; the control voltages, and hence the electric fields, for each set 52,54 can be static or dynamic; and the stack lengths can be equal or different, as needed and available.

According to the claimed invention, the stem assembly 40 includes a stem 46, which cooperatively engages the seat 26, and a cap 48 that is moved by the piezoelectric actuator 50 with respect to the tube assembly 10.

When the stem assembly 40 is in the first position, a gap 47 separates contiguous engagement between the stem 46 and the cap 48. It is desirable to have a minimal gap 47 to promote sealing between the seat 26 and the stem 46. However, if the gap 47 is too large, the stroke of the stem 46 due to the displacement of the piezoelectric actuator 50 is diminished, and if the gap 47 is absent, i.e., there is contiguous engagement of the stem 46 and cap 48 in the first position of the stem assembly 40, the sealing force between the stem 46 and the seat 26 may be relieved.

In practice, the fuel injector exhibits dimensional changes due to thermal and pressure effects present in the injector's operating environment. These dimensional changes have a direct effect upon the injector's operating characteristics and performance. The claimed invention determines and, if necessary, corrects for these dimensional changes. Specifically, the size of the gap 47 between the stem 46 and the cap 48 is determined and compared to a target range for the gap 47.

Figure 2:
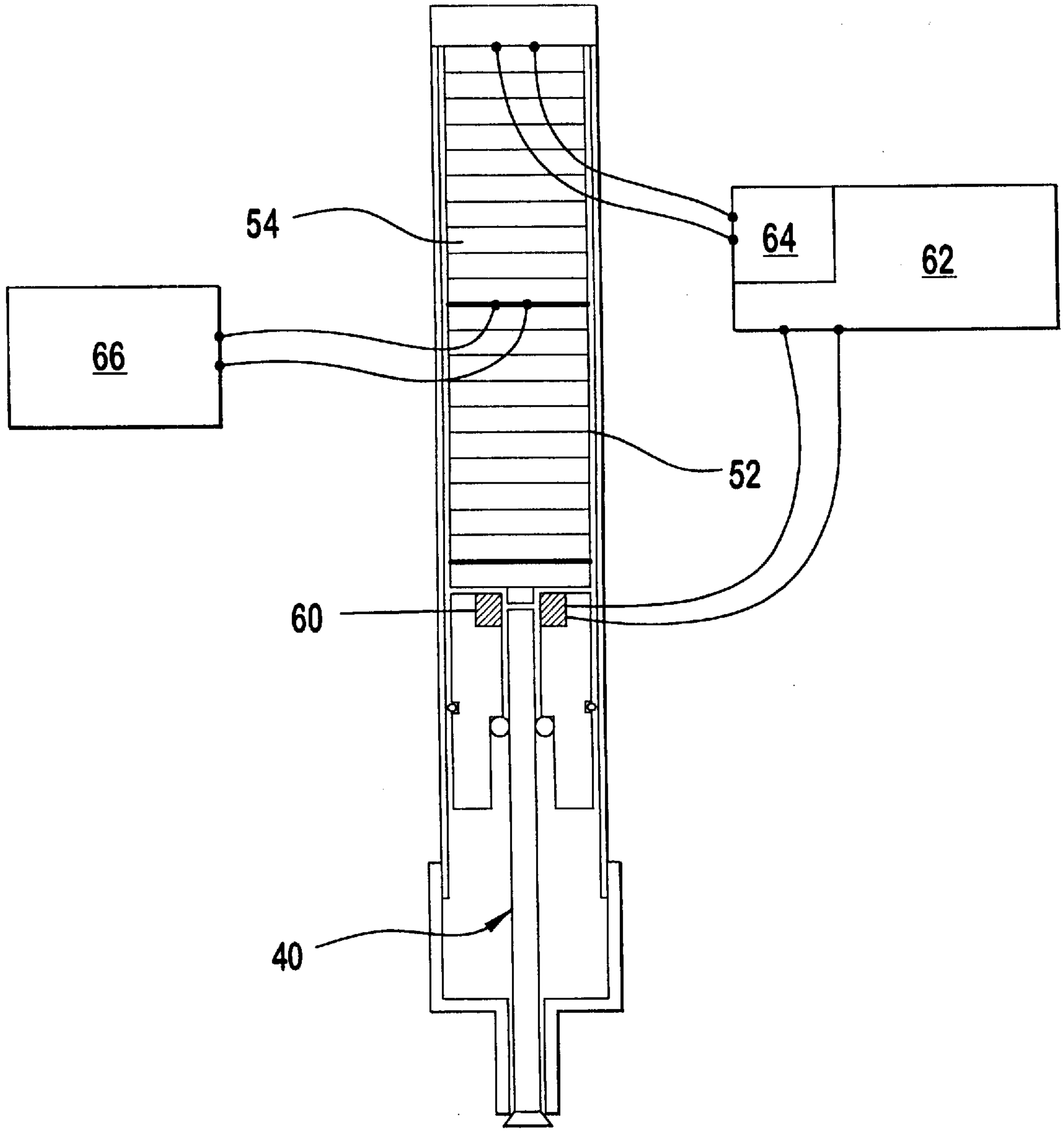
FIG. 2 is a schematic illustration of a control circuit for a piezoelectric actuator according to the claimed invention.

Referring also to FIG. 2, a sense-coil 60 can be used to determine the size of the gap 47 between the stem 46 and the cap 48. The sense-coil 60 is located so as to surround the junction between the stem 46 and the cap 48. As shown in FIG. 1, for example, a bobbin for the sense-coil 60 and a guide bushing for the stem 46 can be combined into a single multi-function unit.

During the injector's operation, changes in internal fuel pressure and external temperature will cause the injector to experience dimensional changes. These dimensional changes will result in an increase/decrease of the gap 47 between the stem 46 and the cap 48. The sense-coil 60 outputs a signal, which corresponds to the size of the gap 47, to a controller 62. The controller 62 interprets and compares the output signal to one or more reference signals that correspond to a target gap range. If correction is required, i.e., if the size of the gap 47 is outside the target gap range, a closed loop circuit compensates the voltage applied to the second set of piezoelectric elements 54 to maintain the target gap range. The closed loop circuit can include the sense-coil 60, the controller 62, a driver 64 supplying the compensated voltage signal, and the second set of piezoelectric elements 54. Controlled actuation of the second set of piezoelectric elements 54 permits control of the gap size, and allows for optimizing injector performance.

Figure 3:
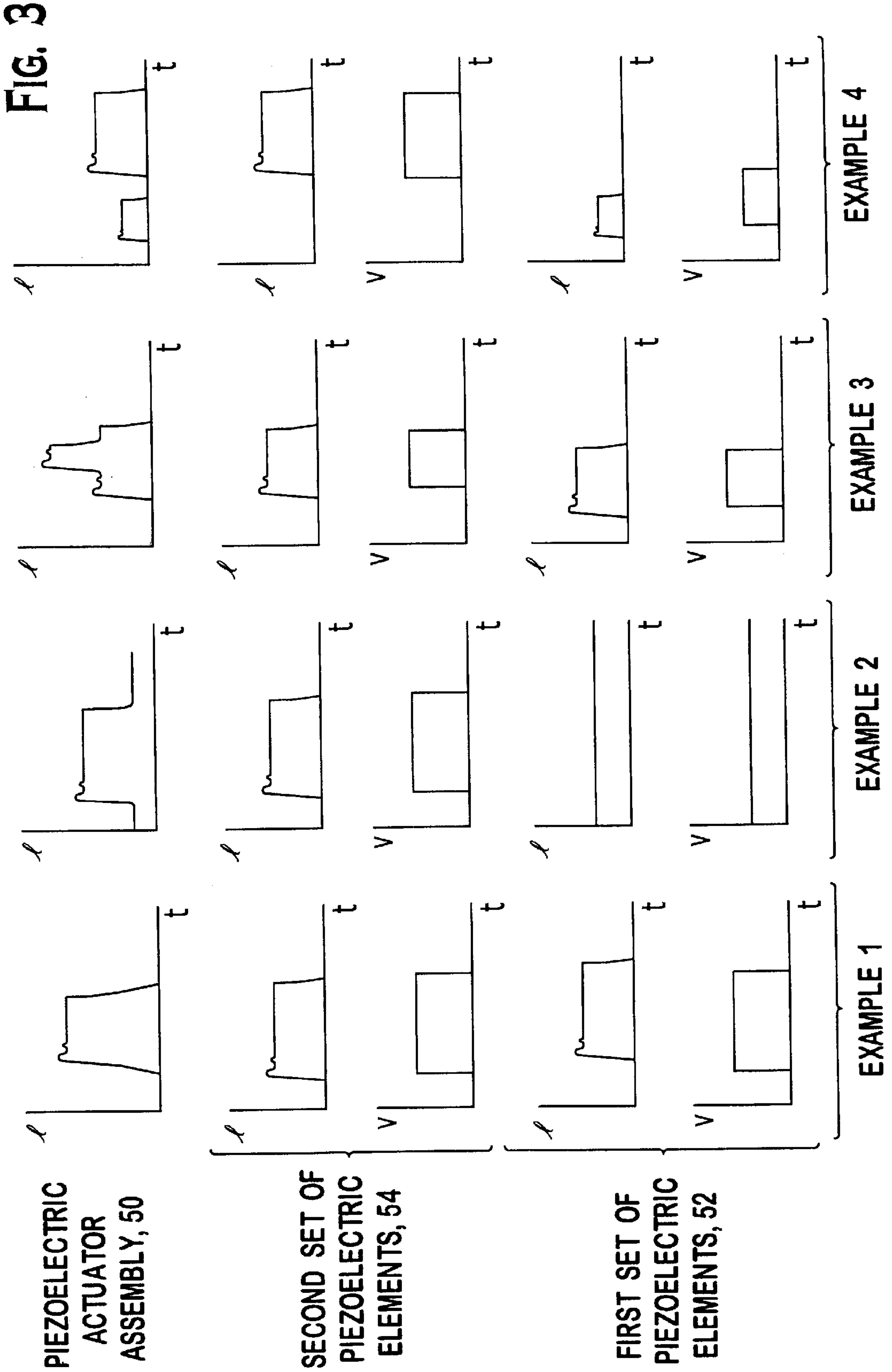
FIG. 3 is a diagram illustrating four examples of lift summation for a two set piezoelectric actuator according to the claimed invention.

Another driver 66 supplies a voltage signal generating the electric field for the first set of piezoelectric elements 52. As shown in FIG. 3, the voltage signal applied across the first set of piezoelectric elements 52 can be different from the voltage signal applied across the second set of piezoelectric elements 54. Accordingly, the claimed invention can improve performance and control flexibility of a piezoelectrically actuated fuel injector. For example, the first and second sets of piezoelectric elements 52,54 can increase the valve lift, compensate for component length changes due to thermal load and mechanical load, or shape a particular lift trace.

The claimed invention is not limited to two sets of piezoelectric elements, and can included three or more sets of piezoelectric elements.

While the present invention has been disclosed with reference to certain embodiments, numerous modifications, alterations, and changes to the described embodiments are possible without departing from the sphere and scope of the present invention, as defined in the appended claims. Accordingly, it is intended that the present invention not be limited to the described embodiments, but that it have the full scope defined by the language of the following claims, and equivalents thereof.

What we claim is:

1. A fuel injector comprising:

a tube assembly having a longitudinal axis extending between a first end and a second end;

a seat secured at the second end of the tube assembly, the seat defining an opening;

a stem assembly including a cap movable with respect to the tube assembly and a stem movable with respect to the seat, the stem moving between a first position wherein the stem contiguously engages the seat such that fuel flow through the opening is prevented and a second position wherein the stem is spaced from the seat such that fuel flow through the opening is permitted;

a gap being formed between the cap and the stem in the first position and being eliminated in the second position of the stem, the gap promoting sealing between the seat and the stem in the first position;

a first set of piezoelectric elements contiguously engaging the cap, the first set of piezoelectric elements moving the cap in response to a first electric field; and a second set of piezoelectric elements adjacent to the first set of piezoelectric elements, the second set moving the first set of piezoelectric elements in response to a second electric field.

2. The fuel injector according to claim 1, wherein electromechanical extension and contraction of the first set of piezoelectric elements is along a first axis, and electromechanical extension and contraction of the second set of piezoelectric elements is along a second axis substantially parallel to the first axis.

3. The fuel injector according to claim 1, wherein the first electric field moves the stem assembly from the first position to the second position.

4. The fuel injector according to claim 1, wherein the stem assembly comprises only the stem confronting the cap over a minimal gap such that no intermediate member is disposed therebetween in the first position of the stem assembly.

5. The fuel injector according to claim 1, wherein the first and second sets of piezoelectric elements are contiguous to each other.

6. A fuel injector comprising:

a tube assembly having a longitudinal axis extending between a first end and a second end;

a seat secured at the second end of the tube assembly, the seat defining an opening;

a stem assembly including a cap movable with respect to the tube assembly and a stem movable with respect to the seat, the stem moving between a first position wherein the stem contiguously engages the seat such that fuel flow through the opening is prevented and a second position wherein the stem is spaced from the seat such that fuel flow through the opening is permitted;

a gap being formed between the cap and the stem in the first position and being eliminated in the second position of the stem;

a first set of piezoelectric elements contiguously engaging the cap, the first set of piezoelectric elements moving the cap in response to a first electric field; a second set of piezoelectric elements adjacent to the first set of piezoelectric elements, the second set moving the first set of piezoelectric elements in response to a second electric field; and a sensor measuring the gap and being electrically interconnected with the second electrical field.

7. The fuel injector according to claim 6, wherein the sensor includes a coil surrounding the gap.

8. The fuel injector according to claim 6, wherein the gap has a size that is proportional to physical changes in at least one of the tube and stem assemblies.

9. The fuel injector according to claim 8, wherein the physical changes include at least one of thermal expansion and mechanical deformation.

* * * * *